United States Patent [19]

Boyer

[11] Patent Number: 4,554,417
[45] Date of Patent: Nov. 19, 1985

[54] TANDEM ADAPTIVE ECHO CANCELER ARRANGEMENT

[75] Inventor: Kim L. Boyer, Walkersville, Md.

[73] Assignee: AT&T Bell Laboratories, Murray Hill, N.J.

[21] Appl. No.: 464,054

[22] Filed: Feb. 4, 1983

[51] Int. Cl.$^4$ ............................................. H04B 3/20
[52] U.S. Cl. ............................ 179/170.2; 179/170.6
[58] Field of Search ............... 179/170.2, 170.6, 170.8; 333/18, 166; 364/724

[56] References Cited

U.S. PATENT DOCUMENTS

| | | | |
|---|---|---|---|
| 3,500,000 | 3/1970 | Kelly et al. | 179/170.2 |
| 3,597,541 | 8/1971 | Proakis et al. | 179/170.2 |
| 3,732,410 | 5/1973 | Mackechnie | 179/170.2 |
| 3,787,645 | 1/1974 | Ochiai et al. | 179/170.2 |
| 3,828,147 | 8/1974 | Ochiai et al. | 179/170.2 |
| 4,359,778 | 11/1982 | Lee | 179/170.2 |
| 4,377,793 | 3/1983 | Horna | 333/165 |

OTHER PUBLICATIONS

"A High Speed Digital Adaptive Echo Canceler", N. Demytko et al., Australian Telecommunications Research, vol. 7, No. 1, 1973, pp. 20–28.
"Extended Range Echo Cancelers", by O. A. Horna, IEEE Southeastern 1981 Conference Proceedings, pp. 846–853.

Primary Examiner—Thomas W. Brown
Assistant Examiner—R. Vaas
Attorney, Agent, or Firm—Thomas Stafford

[57] ABSTRACT

An extended impulse response characteristic is obtained by switchably connecting (via 13, 14, 15) at least first (10) and second (12) adaptive echo cancelers in a tandem connection (FIG. 1). A delay unit (11) is associated with a receive input (X) of the second adaptive echo canceler (12) so that each filter models a different portion of the extended impulse response characteristic. The relative positions of the adaptive echo cancelers (10, 12) in the tandem connection are controllably switched (via 13, 14, 15 and 16) to insure so-called "good" adaptation of the individual adaptive echo cancelers (10, 12) to minimize misalignment noise. Both adaptive echo cancelers (10, 12) are allowed to adapt initially but upon switching only the adaptive echo canceler (12) in a so-called preferred position in the tandem connection is allowed to adapt while the other adaptive echo canceler (10) is inhibited from further adapting.

11 Claims, 2 Drawing Figures

1

TANDEM ADAPTIVE ECHO CANCELER ARRANGEMENT

TECHNICAL FIELD

This invention relates to adaptive echo cancelers and, more particularly, to a tandem adaptive echo conceler arrangement for obtaining an extended impulse response characteristic.

BACKGROUND OF THE INVENTION

Adaptive echo cancelers operate on an incoming signal to generate an impulse response characteristic in accordance with a prescribed algorithm. Existing adaptive echo cancelers are able to model an impulse response of a limited interval, for example, 16 milliseconds. In some applications it is desirable to model an impulse response having an interval greater than the available interval of an individual adaptive echo canceler. One example is in applications where the round trip electrical delay encountered in a telephone transmission channel is greater than the impulse response interval of an individual echo canceler.

One solution to this problem is to use a "truly" cascadable adaptive echo canceler. In such an arrangement each canceler uses a common error signal to update the impulse response estimate. In order to do this the individual adaptive echo cancelers must be arranged circuit wise to facilitate inputting the common error signal to the impulse response updating circuitry. Such a truly cascadable echo canceler including an adaptive filter is manufactured by Western Electric Company. However, most presently available adaptive echo cancelers do not have this capability.

Consequently, in order to address the need for a longer impulse response interval with most existing adaptive echo cancelers a tandem arrangement is required. Attempts at tandeming echo cancelers have heretofore yielded less than desirable results. One arrangement includes having two cancelers connected in tandem with a fixed delay connected in the receive side of one of them. It was hoped that this arrangement would extend the impulse response to twice the interval of an individual echo canceler. A serious problem with this arrangement is that the echo canceler which is the first one to subtract its estimate of a reference signal from an actual reference signal has poor adaptation. This poor adaptation results because the error signal used for updating the impulse response includes the portion of the reference signal which the other echo canceler should estimate. As is known in the art, this results in unwanted misalignment noise.

SUMMARY OF THE INVENTION

An extended impulse response characteristic is realized, in accordance with an aspect of the invention, by switchably connecting a plurality of adaptive echo cancelers in a tandem connection. More specifically, a first adaptive echo canceler arranged to generate a first portion of the extended impulse response interval is switchably connected in tandem with at least a second adaptive echo canceler arranged to generate a second portion of the extended impulse response interval. A switching control circuit is employed to control switching of the relative positions of the adaptive echo cancelers in the tandem connection in accordance with prescribed criteria.

In one example, the first adaptive echo canceler is initially connected in a first so-called preferred position in the tandem connection and the at least second adaptive echo canceler including a predetermined fixed delay in its receive side is connected in a second position in the tandem connection. A received signal is supplied to the receive side of the first adaptive echo canceler and via the delay to the receive side of the at least second adaptive echo canceler, while a transmit signal is first supplied to a transmit input of the at least second adaptive echo canceler and a transmit output signal from the at least second adaptive echo canceler is supplied to a transmit input of the first adaptive echo canceler. A transmit output signal from the first adaptive echo canceler is the initial echo canceler or echo canceler output. Initially, both adaptive echo cancelers are adapting. Upon detection of prescribed canceler output signal conditions the relative positions of the adaptive echo cancelers are controllably reversed, i.e., the at least second adaptive echo canceler including the delay is switched to the preferred position, and the first adaptive echo canceler is inhibited from further adapting and is switched to the second position in the tandem connection. The at least second adaptive echo canceler is allowed to continue adapting.

BRIEF DESCRIPTION OF THE DRAWING

The invention will be more fully understood from the following detailed description of an embodiment thereof taken in conjunction with the appended figures in which.

DETAILED DESCRIPTION

Figure 1:
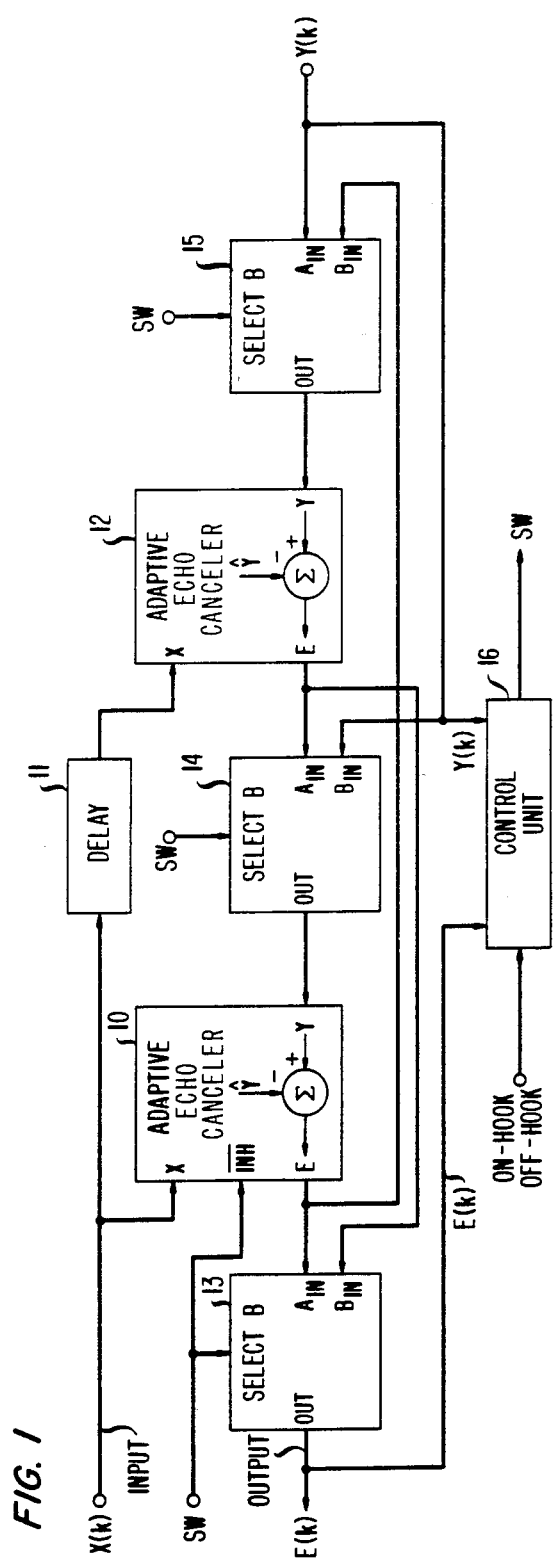
FIG. 1 shows in simplified block diagram form a tandem connection of adaptive echo cancelers including an embodiment of the invention.

FIG. 1 illustrates in simplified block diagram form one embodiment of the invention. Accordingly, a received signal $X(k)$ is supplied to receive input X of adaptive echo canceler 10 and via delay unit 11 to receive input X of adaptive echo canceler 12. Adaptive echo cancelers 10 and 12 may be any one of a number known in the art. In this example, adaptive echo cancelers 10 and 12 are echo cancelers each includes an adaptive transversal filter and are of a type broadly disclosed in U.S. Pat. No. 3,500,000 and described in an article by D. L. Duttweiler and Y. S. Chen entitled, "A Single-Chip VLSI Echo Canceler", *The Bell System Technical Journal*, Vol. 59, No. 2, February 1980, pages 149–160. Briefly, each of adaptive echo cancelers 10 and 12 has a receive input (X), transmit input (Y), transmit output (E), and update inhibit input ($\overline{INH}$). The adaptive echo cancelers (echo cancelers) operate in known fashion to generate a signal estimate $\hat{Y}$ which is algebraically combined with a signal supplied to transmit input Y to generate an error signal at the transmit output E. The error signal is used internally in the adaptive echo canceler to update filter tap coefficient values in order to better model the impulse response characteristic being generated and drive the error signal toward a zero value.

Delay unit 11 is employed to fix the portion of the desired extended impulse response characteristic generated by each of adaptive echo cancelers 10 and 12. The delay interval of delay unit 11 is dependent on the number of coefficient taps (Z) in adaptive echo canceler 10 and the sampling interval k being employed. Typically, delay unit 11 includes a shift register having Z stages which is clocked at the sampling rate $k^{-1}$. In one example, the number of taps (Z) is 128 and the sample rate ($k^{-1}$) is 8 kHz. Thus, adaptive echo canceler 10 typically has a zero delay and models a first fixed portion of the extended impulse response, for example, a 16 millisecond interval and adaptive echo canceler 12 has delay unit 11 associated with its receive input (X) and, consequently, models a second fixed portion of the extended impulse response characteristic, for example, an interval from 16 to 32 milliseconds.

Adaptive echo cancelers 10 and 12 are switchably connected in a tandem connection via controllable selector units 13, 14 and 15. As shown, the transmit output (E) of adaptive echo canceler 10 is connected to the $A_{IN}$ input of selector unit 13 and to the $B_{IN}$ input of selector unit 15. Similarly, the transmit output (E) of adaptive echo canceler 12 is connected to the $A_{IN}$ input of selector unit 14 and to the $B_{IN}$ input of selector 13. A signal to be transmitted, for example, Y(k), is supplied to the $A_{IN}$ input of selector unit 15, to the $B_{IN}$ input of selector unit 14 and to control unit 16. Signal Y(k) is, for example, an outgoing signal to be transmitted in an echo canceler application including near-end speech and the echo signal to be cancelled or an arbitrary system signal in an adaptive filter application. An output from selector unit 15 is supplied to transmit input Y of adaptive echo canceler 12. Similarly, an output from selector unit 14 is connected to transmit input Y of adaptive echo canceler 10. An output from selector unit 13 is connected to control unit 16 and is the desired transmit output or error signal E(k). The output from each of selector units 13, 14 and 15 is normally the $A_{IN}$ input and is the $B_{IN}$ input when enabled by a true, i.e., logical 1, switch control signal SW being supplied to the select B input from control unit 16.

Control unit 16 operates to generate switch control signal SW for controllably switching, in accordance with an aspect of the invention, the relative positions of adaptive echo cancelers 10 and 12 in the tandem connection. Control unit 16 in response to an ON-HOOK to OFF-HOOK transition indicating initiation of a call generates a false, i.e., logical 0, switch control signal SW. Upon a prescribed relationship between error signal E(k) and transmit input signal Y(k) occurring control unit 16 generates a true, i.e., logical 1, switch control signal SW. In one example, control unit 16 compares the error signal E(k) power to the transmit input signal Y(k) power to obtain a measure of the tandem adaptive echo canceler "advantage". Specifically, a scaled version of the transmit input signal power is compared to the error signal power and when the error signal power becomes less than the scaled transmit input signal power the adaptive echo canceler in a preferred position in the tandem connection, initially adaptive echo canceler 10, is assumed to be converged. At this instant, control unit 16 generates a true, i.e., logical 1, SW signal. Consequently, the relative positions of adaptive echo cancelers 10 and 12 are controllably switched, in accordance with an aspect of the invention, in the tandem connection and adaptive echo canceler 10 is inhibited from further adapting. This is realized by selector units 13, 14 and 15 being controlled via signal SW to select input $B_{IN}$ as their outputs and by adaptive echo canceler 10 being inhibited by signal SW. Thus, transmit input signal Y(k) is supplied to transmit input Y of adaptive echo canceler 10, transmit output E of adaptive echo canceler 10 is supplied to transmit input Y of adaptive echo canceler 12 and transmit output E of adaptive echo canceler 12 is error signal E(k).

The reason for switching of the positions of adaptive echo cancelers 10 and 12 is to minimize the effect of noise generated by the adaptive echo cancelers on their convergence. It has been determined that the adaptive in a so-called preferred position in the tandem connection will converge relatively well and cause relatively small amounts of unwanted noise. In this example, adaptive echo canceler 10 is initially in the preferred tandem connection position. Since adaptive echo canceler 10 converges relatively well, it then can be frozen, i.e., inhibited from further adapting, and switched to the other position in the connection while adaptive echo canceler 12 is switched to the preferred position and is allowed to adapt. Since adaptive echo cancelers 12 is now in the preferred position, it will converge relatively well and the misalignment noise introduced by adaptive filters 10 and 12 is minimized.

Figure 2:
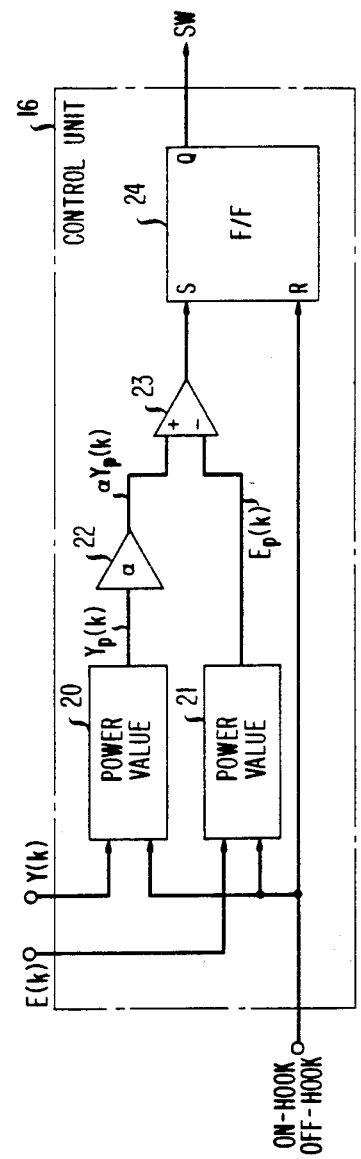
FIG. 2 depicts in simplified block diagram form details of the control unit used in the embodiment of FIG. 1.

FIG. 2 shows in simplified block diagram form details of control unit 16. Accordingly, shown are power value measurement units 20 and 21, amplifier 22, comparator 23 and set-reset flip-flop 24. Transmit input signal Y(k) is supplied to power value measurement unit 20 which generates an output $Y_p(k)$ representative of the power of Y(k). Similarly, error signal E(k) is supplied to power value measurement unit 21 which generates an output $E_p(k)$ representative of the power of E(k). Power value measurement units 20 and 21 are reset in response to an ON-HOOK-OFF-HOOK transition. Signal $Y_p(k)$ is supplied via scaling amplifier 22 to one input of comparator 23 while signal $E_p(k)$ is supplied to another input of comparator 23. The output from comparator 23 is negative, i.e., representative of a logical 0, until $E_p(k) < \alpha Y_p(k)$. When $E_p(k)$ becomes less than $\alpha Y_p(k)$ initial convergence of adaptive filter 10 (FIG. 1) is assumed to be complete and comparator 23 yields a positive output, i.e., representative of a logical 1. To this end, scaling factor $\alpha$ is the expected echo return loss enhancement factor, i.e., the adaptive filter transmit input power less the adaptive filter output power after, for example, echo cancellation in an echo canceler application. In one example of an echo canceler application, $\alpha$ is 20 dB power. An output from comparator 23 is supplied to a set (S) input of flip-flop 24 when the ON-HOOK-OFF-HOOK signal is supplied to a reset (R) input of flip-flop 24. In operation, flip-flop 24 is reset by an ON-HOOK-OFF-HOOK transition to generate a false, i.e., logical 0, SW signal at output Q. Then, when $E_p(k)$ becomes less than $\alpha Y_p(k)$ flip-flop 24 is set by a logical 1 output from scaling amplifier 23 to generate a true, i.e., logical 1 SW signal at output Q.

Each of power measurement units 20 and 21 includes apparatus (not shown) for squaring the supplied input sample values and a low pass filter for obtaining smooth versions of the desired power measurement values in well known fashion.

What is claimed is:
1. Apparatus including,
   a first adaptive echo canceler having a receive input, a transmit input and a transmit output, and
   at least a second adaptive echo canceler having a receive input, a transmit input and a transmit output,
   said apparatus characterized by, means for switchably connecting said transmit inputs and transmit outputs of said adaptive echo cancelers in a tandem connection, and means for controlling switching of the relative positions of said transmit inputs and transmit outputs of said adaptive echo cancelers in said tandem connection, wherein an extended impulse response is obtained.

2. The apparatus as defined in claim 1 wherein said first adaptive echo canceler is adapted to generate a first predetermined portion of said extended impulse response and said at least second adaptive echo canceler is adapted to generate an at least second predetermined portion of said extended impulse response.

3. The apparatus as defined in claim 2 wherein said switching controlling means includes means for generating a control signal, and said connecting means being responsive to said control signal for connecting said first adaptive echo canceler transmit input and transmit output so that said first adaptive echo canceler is effectively in a first position in said tandem connection and said at least second adaptive echo canceler transmit input and transmit output so that said second adaptive echo canceler is effectively in a second position in said tandem connection and for switching said adaptive echo canceler transmit inputs and transmit outputs to effectively switch the positions of said adaptive echo cancelers upon a change in said control signal generated in accordance with prescribed criteria dependent on an output from said tandem connection.

4. The apparatus as defined in claim 3 wherein said first adaptive echo canceler includes means responsive to said change in said control signal for inhibiting further adaptation, and further includes delay means having a predetermined delay interval connected in circuit with said receive input of said at least second adaptive echo canceler.

5. Apparatus including,
a first adaptive echo canceler having a receive input, a transmit input and a transmit output,
at least a second adaptive echo canceler having a receive input, a transmit input and a transmit output,
means having a predetermined delay interval connected in circuit with said receive input of said at least second adaptive echo canceler for delaying signals supplied thereto, and
means for supplying an input signal to said first adaptive echo canceler receive input and to said means for delaying, said apparatus characterized by,
means for switchably connecting said transmit inputs and transmit outputs of said adaptive echo cancelers in a tandem connection, and
means for controlling switching of said transmit inputs and transmit outputs to effectively switch the relative positions of said adaptive echo cancelers in said tandem connection, wherein an extended impulse response interval is obtained.

6. The apparatus as defined in claim 5 wherein said first adaptive echo canceler is adapted to generate a first predetermined portion of said extended impulse response interval and said at least second adaptive echo canceler in conjunction with said means for delaying is adapted to generate an at least second predetermined portion of said extended impulse response interval.

7. The apparatus as defined in claim 6 wherein said switchably connecting means is connected in prescribed circuit relationship with said adaptive echo cancelers transmit inputs and transmit outputs so that the relative positions of said adaptive echo cancelers are switchable in said tandem connection without switching the portion of said extended impulse response interval that each of said adaptive echo cancelers generates.

8. The apparatus as defined in claim 7 wherein said switching controlling means includes means for generating a control signal, and said connecting means being responsive to said control signal for connecting said first adaptive echo canceler transmit input and transmit output so that said first echo canceler is in a first position in said tandem connection and said at least second adaptive echo canceler transmit input and transmit output so that said at least second echo canceler is in a second position in said tandem connection and for switching said transmit inputs and transmit outputs of said adaptive echo cancelers so that the positions of said echo cancelers in said tandem connection are effectively switched upon a change in said control signal generated in accordance with prescribed criteria dependent on an output from said tandem connection.

9. The apparatus as defined in claim 8 wherein said first adaptive echo canceler includes means responsive to said change in said control signal for inhibiting further adaptation.

10. The apparatus as defined in claim 9 wherein said switchably connecting means is responsive to a first condition of said control signal to supply an outgoing signal to said at least second adaptive echo canceler transmit input, to a connect said at least second adaptive echo canceler transmit output to said first adaptive echo canceler transmit input and to connect said first adaptive echo canceler transmit output to an output of said apparatus and to a second condition of said control signal to supply said outgoing signal to said first adaptive echo canceler transmit input, to connect said first adaptive echo canceler transmit output to said at least second adaptive echo canceler transmit input and to connect said at least second adaptive echo canceler transmit output to said apparatus output.

11. The apparatus as defined in claim 10 wherein said change in said control signal is generated dependent on a predetermined relationship between power of a signal developed at said first adaptive echo canceler transmit output and power of said outgoing signal.

* * * * *